United States Patent
Liao et al.

(10) Patent No.: US 7,319,063 B2
(45) Date of Patent: Jan. 15, 2008

(54) FIN FIELD EFFECT TRANSISTOR AND METHOD FOR MANUFACTURING FIN FIELD EFFECT TRANSISTOR

(75) Inventors: Wen-Shiang Liao, Miaoli Hsien (TW); Wei-Tsun Shiau, Meinong Township, Kaohsiung County (TW); Kuan-Yang Liao, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 295 days.

(21) Appl. No.: 11/049,819

(22) Filed: Feb. 2, 2005

(65) Prior Publication Data

US 2006/0172476 A1    Aug. 3, 2006

(51) Int. Cl.
*H01L 21/336* (2006.01)

(52) U.S. Cl. .................. 438/592; 438/299; 257/412; 257/E21.439

(58) Field of Classification Search ............... 438/592, 438/299; 257/412, E21.439
See application file for complete search history.

(56) References Cited

U.S. PATENT DOCUMENTS

| 6,376,320 | B1 * | 4/2002 | Yu ........................ 438/303 |
| 6,929,992 | B1 * | 8/2005 | Djomehri et al. ......... 438/199 |
| 2003/0008487 | A1 * | 1/2003 | Iwai ....................... 438/586 |
| 2004/0061191 | A1 * | 4/2004 | Paton et al. ............. 257/412 |
| 2006/0011996 | A1 * | 1/2006 | Wu et al. ................ 257/412 |

\* cited by examiner

*Primary Examiner*—B. William Baumeister
*Assistant Examiner*—Steven J. Fulk
(74) *Attorney, Agent, or Firm*—J.C. Patents

(57) ABSTRACT

The invention is directed to a method for manufacturing a fin field effect transistor including a fully silicidated gate electrode. The method is suitable for a substrate including a fin structure, a straddle gate, a source/drain region and a dielectric layer formed thereon, wherein the straddle gate straddles over the fin structure, the source/drain region is located in a portion of the fin structure exposed by the straddle gate and the dielectric layer covers the substrate. The method includes steps of performing a planarization process to remove a portion of the dielectric layer and the first salicide layer until the surface of the straddle gate is exposed and performing a salicide process to convert the straddle gate into a fully silicidated gate electrode.

16 Claims, 8 Drawing Sheets

FIN FIELD EFFECT TRANSISTOR AND METHOD FOR MANUFACTURING FIN FIELD EFFECT TRANSISTOR

BACKGROUND OF THE INVENTION

1. Field of Invention

The present invention relates to a fin field effect transistors (FinFETs) and a method for manufacturing the FinFETs. More particularly, the present invention relates to a FinFET with a fully silicidated gate electrode and a method for manufacturing thereof.

2. Description of Related Art

FinFETs have been demostrated to have better scalibility than traditional bulk transistors. Generally, the operations of digital circuit depend on the ability to switch MOS devices from an ON state to an OFF state and vice versa. If the threshold voltage for N-type MOS is not much difference from that for P-type MOS even the margin of the ON and OFF state of the N-type MOS seriously overlap with that of the P-type MOS under general operating current, the circuit will be malfunction under specific operating voltage range.

FIG. 1 shows the Id-Vg (drain current versus gate voltage) plots for the conventional FinFETs. It is well known in the art that while a positive voltage, which is higher than the threshold voltage of the N-type MOS, is applied on the gate of the N-type MOS, an N-channel is formed under the gate and between the source and drain, and then the N-type MOS is turned on under a proper bias. Similarly, while a negative voltage, which is lower than the threshold voltage of the P-type MOS, is applied on the gate of the P-type MOS, a P-channel is formed under the gate and between the source and drain, and then the P-type MOS is turned on under a proper bias. However, as shown in FIG. 1, while a positive voltage of about 0.25V is applied on the gate, not only the N-type MOS is turned on, but also there is current of about $10^{-7}$ Amp passing through the drain of the P-type MOS. That is, the P-type MOS is also turned on. Similarly, while a negative voltage of about –0.25V is applied on the gate, the P-type MOS is turned on and the N-type MOS is turned on as well. Therefore, it is easily to induce circuit malfunction under this kind of circumstance. Even while the drain current is about of $10^{-6}$, which is a general drain current under the normal circuit operation, it is also possible to turn on the P-type MOS and the N-type MOS at the same gate voltage.

SUMMARY OF THE INVENTION

The invention provides a method for manufacturing a fin field effect transistor having a fully silicidated gate electrode. The method is suitable for a substrate having a fin structure, a straddle gate and a source/drain region formed thereon, wherein the straddle gate straddles over the fin structure and the source/drain region is located in a portion of the fin structure exposed by the straddle gate. The method comprises steps of performing a first salicide process to form a first salicide layer on the top of the straddle gate and a second salicide layer on the source/drain region. A dielectric layer is formed over the wafer and then a planarization process is performed to remove a portion of the dielectric layer and the first salicide layer until the surface of the straddle gate is exposed. Moreover, a second salicide process is performed to convert the straddle gate into a fully silicidated gate electrode.

The present invention further provides a fin field effect transistor having a fully silicidated gate electrode suitable for a substrate having a fin structure formed thereon. The fin field effect transistors comprises a fully silicidated gate electrode, a source/drain region and a salicide layer. The fully silicidated gate electrode straddles over a portion of the fin structure and the source/drain region is located in the fin structure exposed by the fully silicidated gate electrode and adjacent to the fully silicidated gate electrode. In addition, the salicide layer is located on the source/drain region.

Because the straddle gate of the fin field effect transistor is fully silicidated into a fully silicidated gate electrode, the result workfunction of the fin field effect transistor is properly adjusted so that the margin of ON/OFF voltage of the N-type MOS is apparently distinguished from that of the P-type MOS. Therefore, the device having N-type and P-type FinFETs formed by the method according to the present invention possesses relatively better functionality and performance. Hence, the malfunction problem caused by simultaneously turn on both N-type and P-type FinFETs can be overcome.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
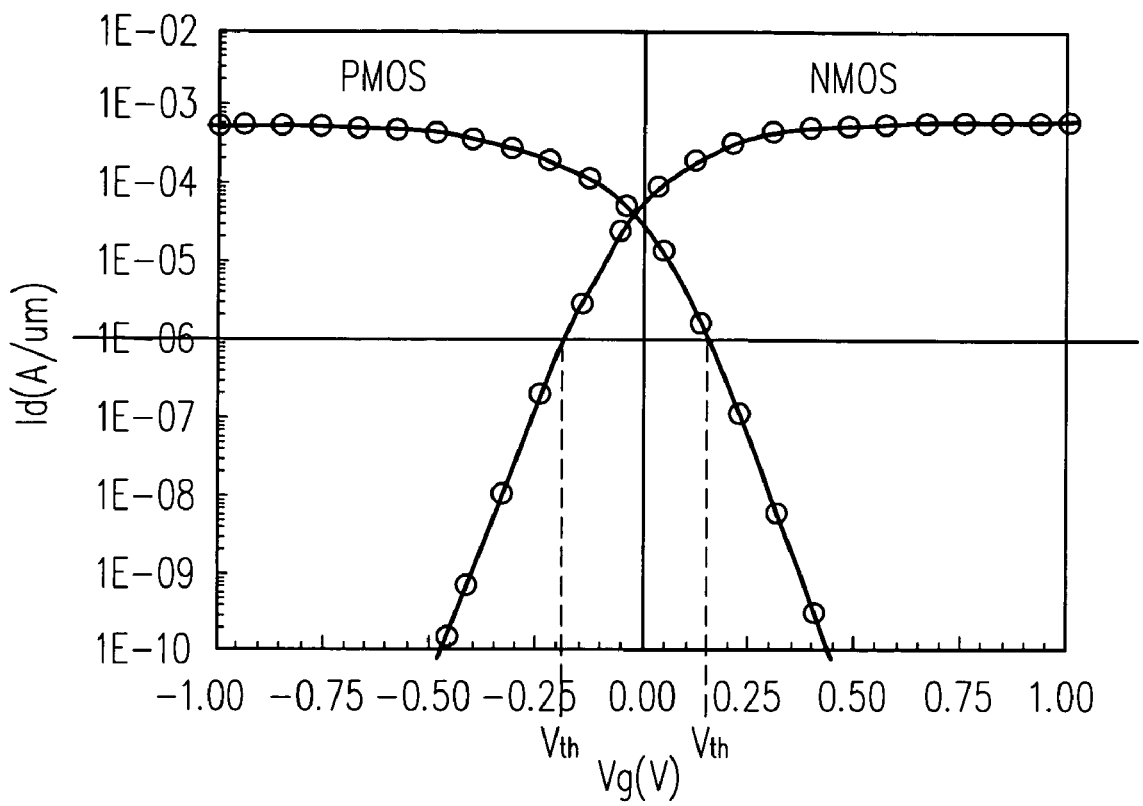
FIG. 1 shows the Id-Vg (drain current versus gate voltage) plots for the conventional FinFETs.

Reference will now be made in detail to the present preferred embodiments of the invention, examples of which are illustrated in the accompanying drawings. Wherever possible, the same reference numbers are used in the drawings and the description to refer to the same or like parts.

Figure 2:
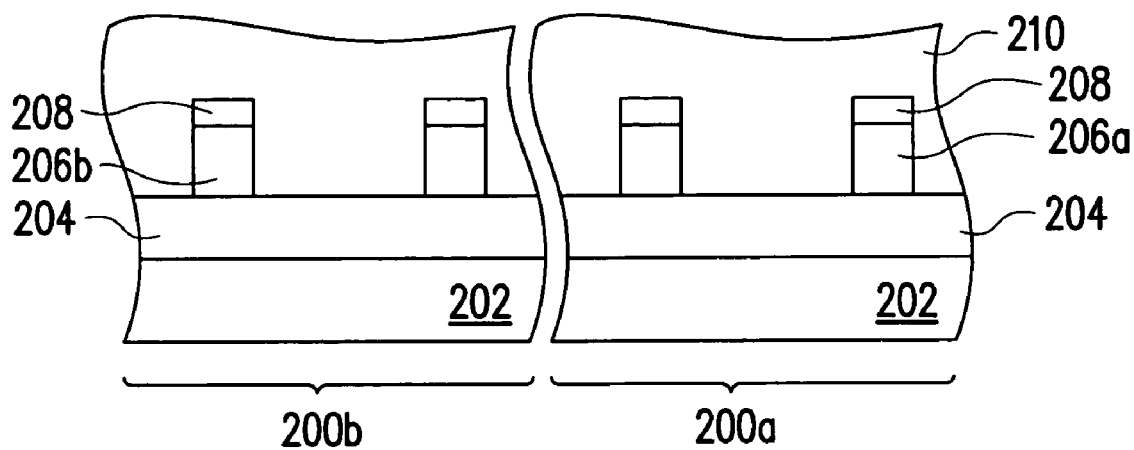
FIGS. 2-3 and 5-10 are perspective views showing the steps for manufacturing FinFETs according to one preferred embodiment of the present invention.

As shown in FIG. 2, an initial structure is provided for fabricating FinFETs according to one embodiment of the present invention. The initial structure shown in FIG. 2 is divided into a region 200a and a region 200b and comprises a substrate 202, an insulating layer 204 and a plurality of fin structures. Moreover, in the region 200a, the fin structure comprises a top cap layer 208 and a raised fin 206a with a first conductive type. Similarly, in the region 200b, the fin structure comprises a top cap layer 208 and a raised fin 206b with a second conductive type. Notably, the first conductive type and the second conductive type can be, for example but not limited to, P type and N type, respectively. The method for forming the initial structure comprises the steps of providing a silicon-on-insulating (SOI) material (not shown)

including, for example, a bottom Si-containing layer (substrate 202), the insulating layer 204 and a top Si-containing layer (not shown). Then, a pattern process is performed to form the fin structures after a dielectric layer (not shown) is formed over the SOI material. The insulating layer 204, such as buried oxide layer, electrically isolates the bottom Si-containing layer from the top Si-containing layer. The Si-containing layer can be semiconductor material including at least silicon. The semiconductor material can be, example but not limited to, silicon (Si), silicon germanium (SiGe), silicon germanium carbide (SiGeC), silicon carbide (SiC), polysilicon, epitaxial silicon, amorphous silicon and multi-layers formed thereof. Further, the dielectric layer can be, for example, a nitrided thermal oxide layer. Moreover, the pattern process for forming the fin structure comprises the steps of forming a patterned photoresist layer (not shown) over the SOI material and then patterning the dielectric layer and the SOI material until the surface of the insulating layer 204 is exposed to form the raised-undoped fin and the cap layer 208. Then, a patterned photoresist layer (not shown) is formed over the region 200b to expose the region 200a. Thereafter, an ion implantation process is performed to implant ions with the first conductive type into the raised-undoped fin in the region 200a and the raised-undoped fin in region 200a is transformed into the fin 206a. The ions for forming fin 206a can be, for example but not limited to, boron ions. Then the patterned photoresist layer is removed. After, a patterned photoresist layer (not shown) is formed over the region 200a to expose the region 200b. Thereafter, an ion implantation process is performed to implant ions with the second conductive type into the raised-undoped fin in the region 200b and the raised-undoped fin in region 200b is transformed into the fin 206b. The ions for forming fin 206b can be, for example but not limited to, phosphorous ions. Then, the patterned photoresist layer is removed. Before the steps for forming the fin 206a and the fin 206b, it can comprises, for example, a step of forming a sacrificial oxide layer (not shown) on the sidewall of the raised fin to protect the raised-undoped fin from being damaged by subsequent performed implantation process. Thereafter, a gate material layer 210 is formed over the region 200a and the region 200b. The gate material layer 210 can be, for example but not limited to, an undoped polysilicon layer.

Figure 3:
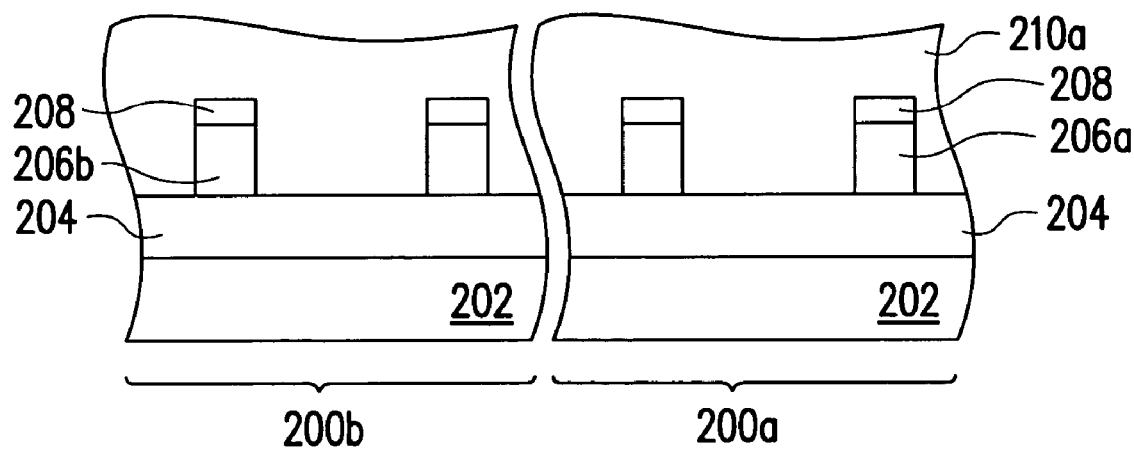

As shown in FIG. 3, a patterned photoresist layer (not shown) is formed over the region 200b to expose the region 200a. An ion implantation process is performed to implant ions with the second conductive type into a portion of the gate material layer 210 in the region 200a and transform the portion of the gate material layer 210 into a doped gate material layer 210a. The ions used in the ion implantation process can be, for example, phosphorous ions. Next, the patterned photoresist layer is removed. After the ion implantation process is performed, it further comprises, for example, a step of annealing process. The annealing process can be, for example, a rapid thermal process performing at temperature of about 850 centigrade for about 20 seconds.

Figure 4:
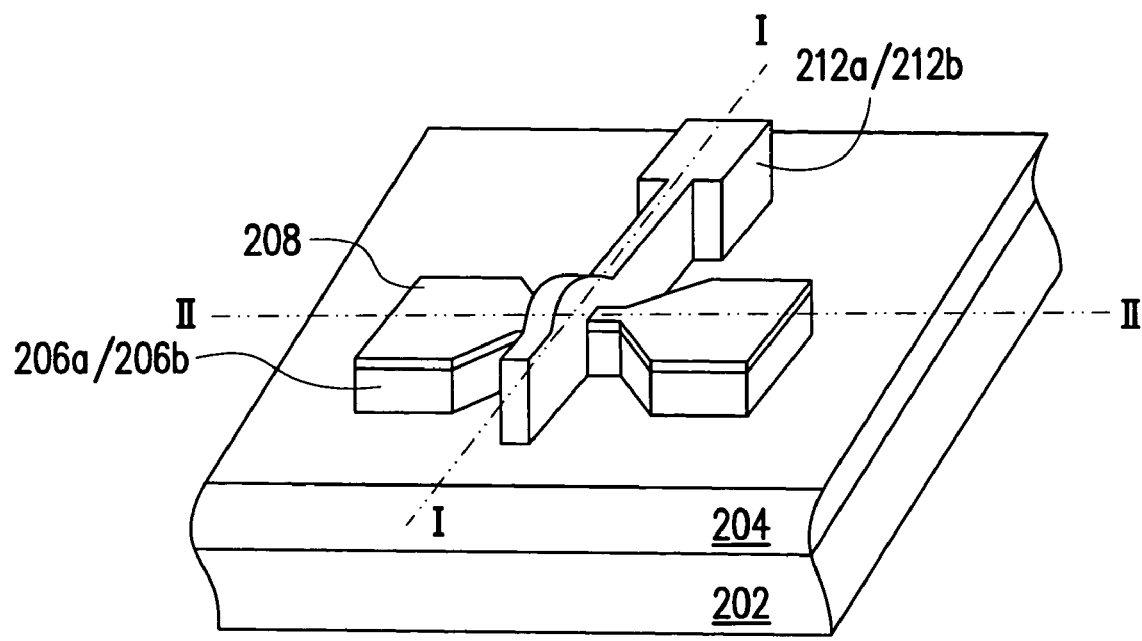
FIG. 4 is a 3-D schema of a FinFET.
Figure 4A:
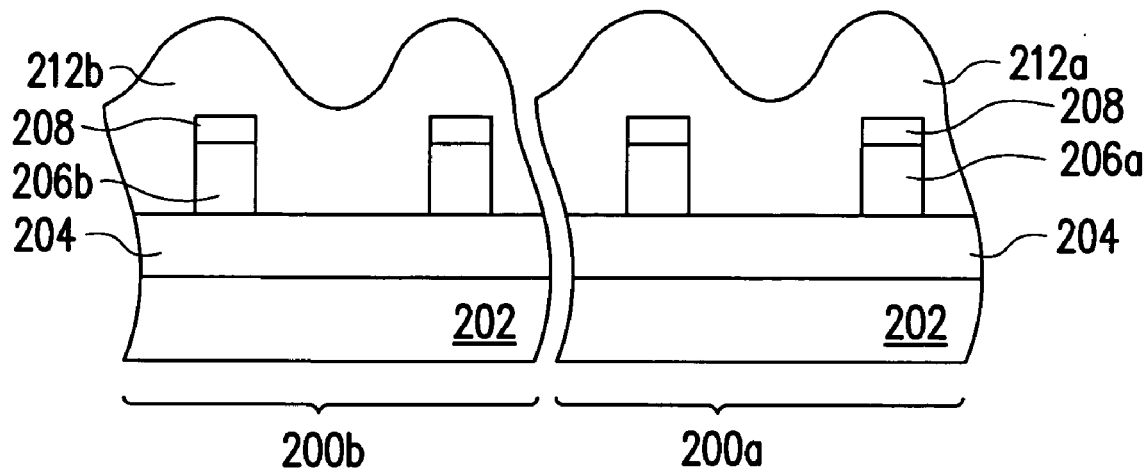
FIG. 4A is a cross-sectional view along line I-I of FIG. 4.
Figure 4B:
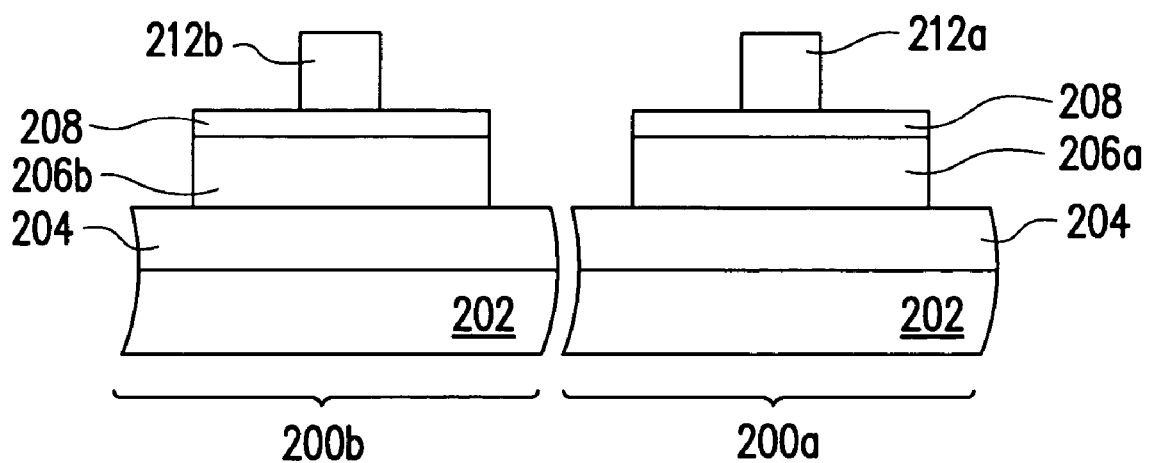
FIG. 4B is a cross-sectional view along line II-II of FIG. 4.

A pattern process is performed to pattern the gate material layer 210a in region 200a and the gate material layer 210 in the region 200b to form a straddle gates 212a and 212b, respectively. FIG. 4 is a 3-D schema of one of FinFETs comprising the straddle gate 212a/212b and the fin 206a/206b after the pattern process is performed. FIG. 4A is a cross-sectional view along line I-I of FIG. 4. FIG. 4B is a cross-sectional view along line II-II of FIG. 4.

Figure 5:
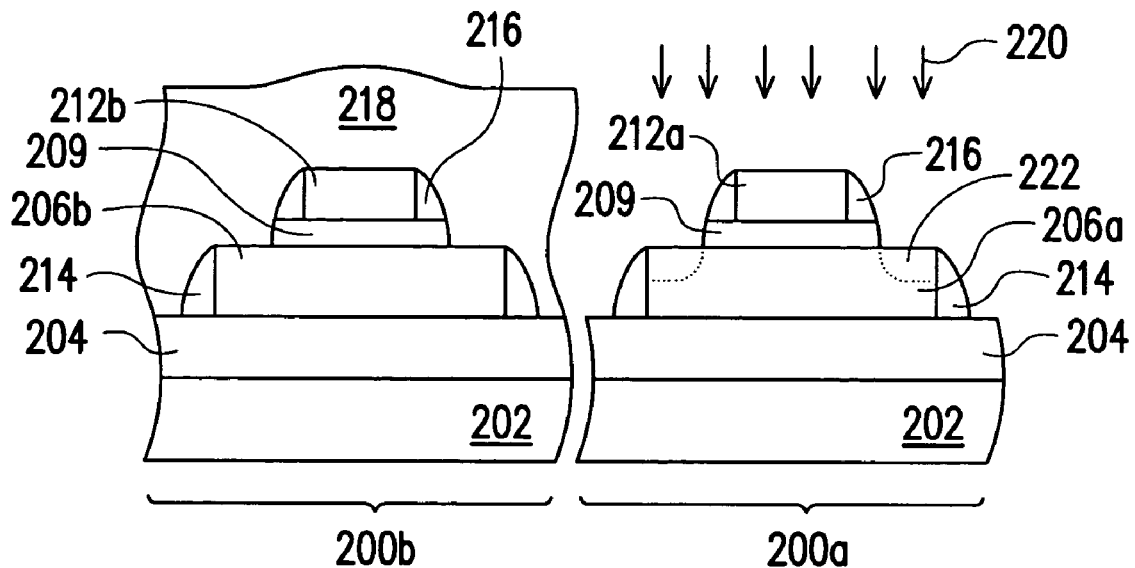
Figure 6:
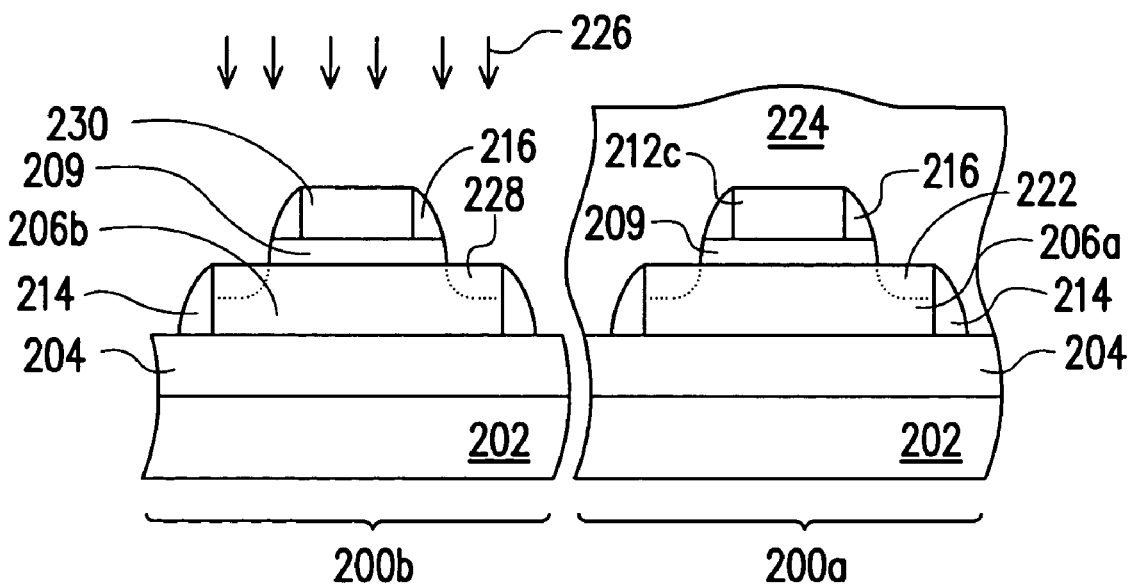

FIG. 5 shows the cross-sectional view after the following processes are performed on the structure shown in FIG. 4B. As shown in FIG. 5, a spacer structure 216 is formed on the sidewall constructed by straddle gate 212a/212b and a cap layer 209. Simultaneously, a spacer structure 214 is formed on the sidewalls of fin 206a and 206b. The method for forming the spacer structures 216 and 214 comprises the steps of forming an oxide layer (not shown) and a silicon nitride layer (not shown) over the regions 200a and 200b sequentially and performing an etching process to remove a portion of the silicon nitride layer and the oxide layer to form the spacer structures 214 and 216. The thickness of the oxide layer can be, for example, of about 80~100 angstroms and the thickness of the silicon nitride layer can be, for example, of about 500 angstroms. Thereafter, by using the straddle gates 212a and 212b and spacer structure 216 as a mask, a portion of the cap layer 208 (as shown in FIG. 4) in both regions 200a and 200b is removed to expose a portion of the fin 206a and fin 206b (as shown in FIG. 5), wherein the cap layer 208 is converted into the cap layer 209. A patterned photoresist layer 218 is formed over the region 200b to expose the region 200a. By using the straddle gate 212a and the spacer 216 as a mask, an ion implantation process 220 is performed on the region 200a to form a source/drain region 222 with the second conductive type in the fin 206a and to increase the density of the second conductive type ions in the straddle gate 212a. Therefore, the straddle gate 212a (as shown in FIG. 5) is converted into a straddle gate 212c (as shown in FIG. 6). The ion implantation process comprises the steps of implanting phosphorous ions of about $6 \times 10^{13}$ ions/cm$^2$ and implanting arsenic ions of about $3 \times 10^{15}$ ions/cm$^2$, subsequently.

As shown in FIG. 6, the patterned photoresist layer 218 is removed. Another patterned photoresist layer 224 is formed over the region 200a to expose the region 200b. By using the undoped straddle gate 212b and the spacer 216 as a mask, an ion implantation process 226 is performed on the region 200b to form a source/drain region 228 with the first conductive type in the fin 206b and to convert the undoped straddle gate 212b into a straddle gate 230 with the first conductive type. The ion implantation process comprises a step of implanting boron ions of about $5 \times 10^{13}$ ions/cm$^2$-$3 \times 10^{15}$ ions/cm$^2$.

Figure 7:
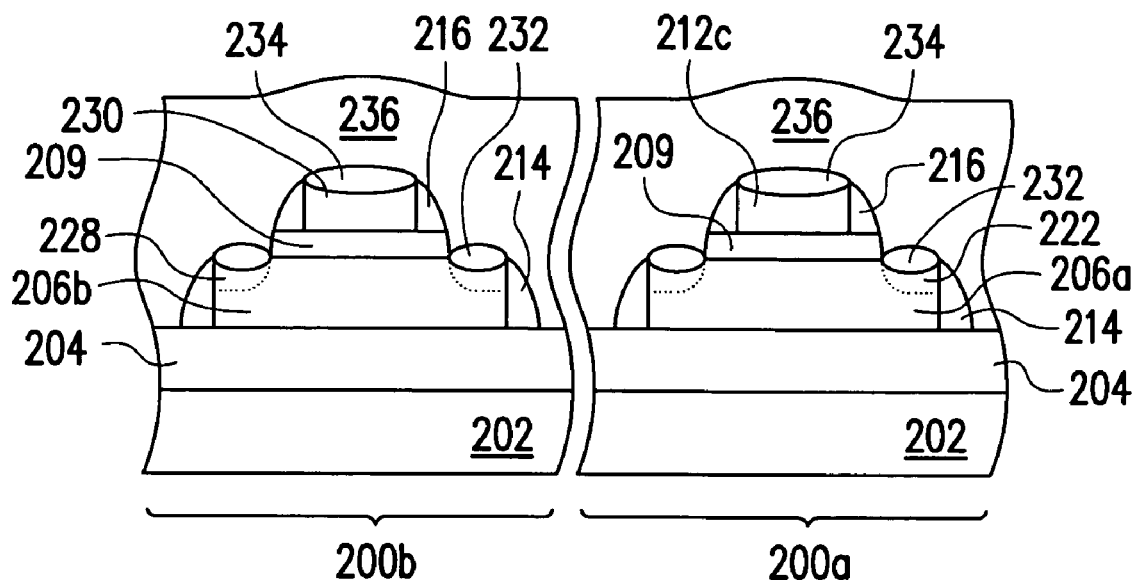

As shown in FIG. 7, the patterned photoresist layer 224 is removed. A first salicide process is performed to form a salicide layer 234 on the top of the straddle gates 212c and 230 and to form a salicide layer 232 on the source/drain regions 222 and 228. The first salicide process comprises the steps of forming a metal layer, such as a Nickel layer or a Cobalt layer, over the entire structure and performing silicide sintering to form the salicide layers 232 and 234 and then removing the unreacted metal layer. Thereafter, an isolation dielectric layer 236 is formed over the regions 200a and 200b. The method for forming the isolation dielectric layer 236 comprises, for example but not limited to, the steps of forming an undoped silicon glass, of about 2000 angstroms, made of oxide over the regions 200a and 200b and forming a phosphosilicate glass of about 5000 angstroms over the regions 200a and 200b. In addition, the isolation dielectric layer 236 can be, for example but not limited to, a composite layer comprising a nitride layer and an oxide layer. Further, the thickness of the nitride layer of the composite layer is of about 380 angstroms. Also, the oxide layer can be, for example but not limited to, an undoped silicate glass (USG) layer with a thickness of about 2000~4000 angstroms or phosphate silicate glass (PSG) layer or the composition thereof.

Figure 8:
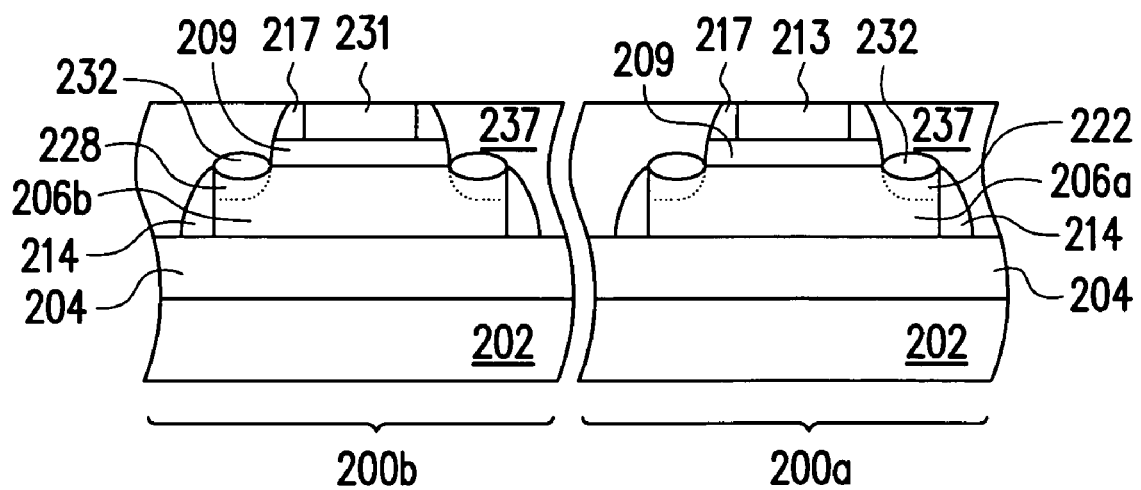

As shown in FIG. 8, a planarization process is performed to remove a portion of the upper isolation dielectric layer 236, the salicide 234 and a portion of the straddle gates 230 and 212c. Therefore, the straddle gates 230 and 212c are converted into straddle gates 231 and 213, respectively. Notably, the exposed surfaces of the straddle gates 231 and 213 are treated as fully silicidated reaction windows in the following salicide process. The planarization process can be, for example, a two step chemical mechanical polishing (CMP) process including a first step of oxide polishing and a second step of polysilicon polishing. Furthermore, the planarization process can be, for example but not limited to, a fixed time-mode CMP for performing the polishing process for a pre-determined period of time.

Figure 9:
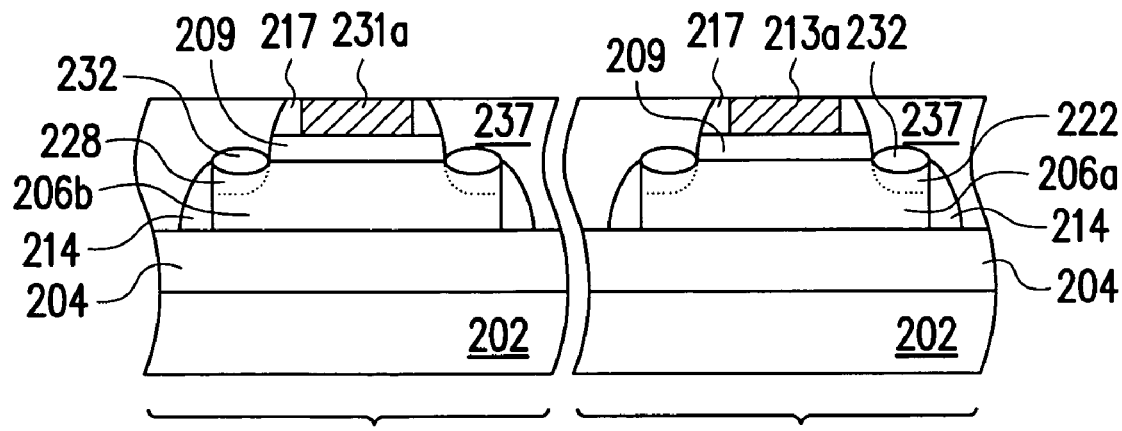

As shown in FIG. 9, a second salicide process is performed to convert the straddle gates 231 and 213 into fully silicidated gate electrodes 231a and 213a respectively. The second salicide process, for example but not limited to, comprises the steps of forming a metal layer, such as a Nickel layer or a Cobalt layer, over the entire structure by sputtering and performing a fully silicidation to covert the straddle gates 231 and 213 into fully silicidated gate electrodes 231a and 213a respectively and then removing the unreacted metal layer. It should be noticed that the fully silicidation comprises the step of performing a thermal process. Therefore, because of the thermal process, the metal atoms can thermally diffuse from the top of the straddle gates 231 and 213 to the bottom of the straddle gates 231 and 213. Then, the metal atoms fully react with the whole the straddle gates 231 and 213 to convert the straddle gates 231 and 213 into the fully silicidated gate electrodes 231a and 213a respectively. Furthermore, the thermal process can be, for example but not limited to, a rapid thermal process. Moreover, when the metal layer is a Nickel layer, the temperature for performing the thermal process is of about 450 centigrade. Alternatively, when the metal layer is a Cobalt layer, the temperature for performing the thermal process is of about 750 centigrade. Further, the fully silicidated gate electrodes 231a and 213a can be, for example but not limited to, a Cobalt fully silicide gate electrode or a Nickel fully silicide gate electrode. In addition, after the unreacted metal layer is removed, another thermal process is performed to further transform the low conductivity metal silicide phase into high conductivity metal silicide phase.

Figure 10:
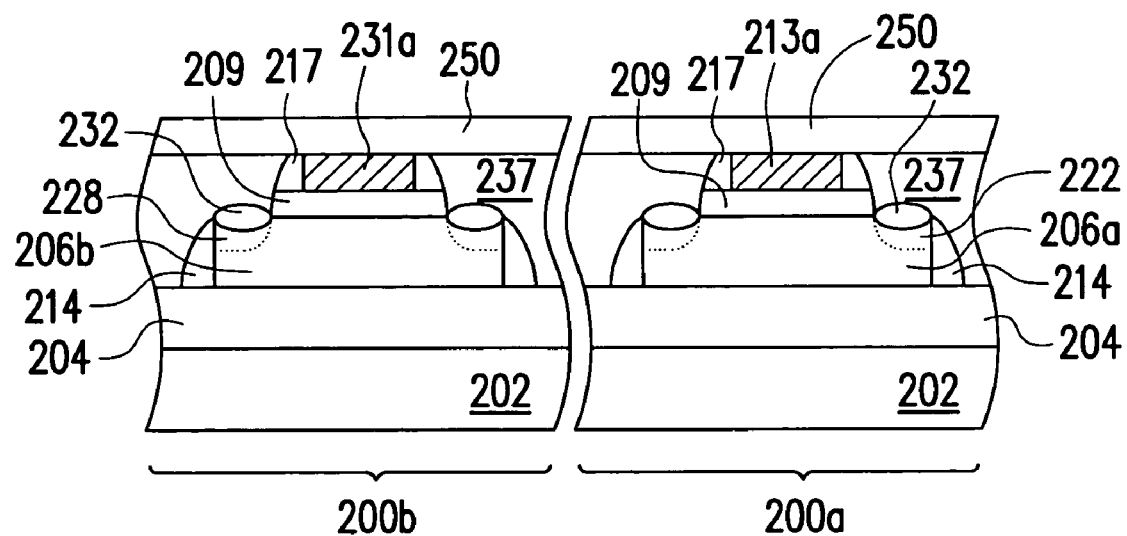

As shown in FIG. 10, a cap layer 250 is formed over the regions 200a and 200b to seal the fully silicidated gate electrodes 231a and 213a. The cap layer 250 can be, for example but not limited to, a composite layer comprising a nitride layer and an oxide layer. Further, the thickness of the nitride layer of the composite layer is of about 380 angstroms. Also, the oxide layer can be, for example but not limited to, an undoped silicate glass (USG) layer with a thickness of about 2000~4000 angstroms or phosphate silicate glass (PSG) layer or the composition thereof.

Figure 11:
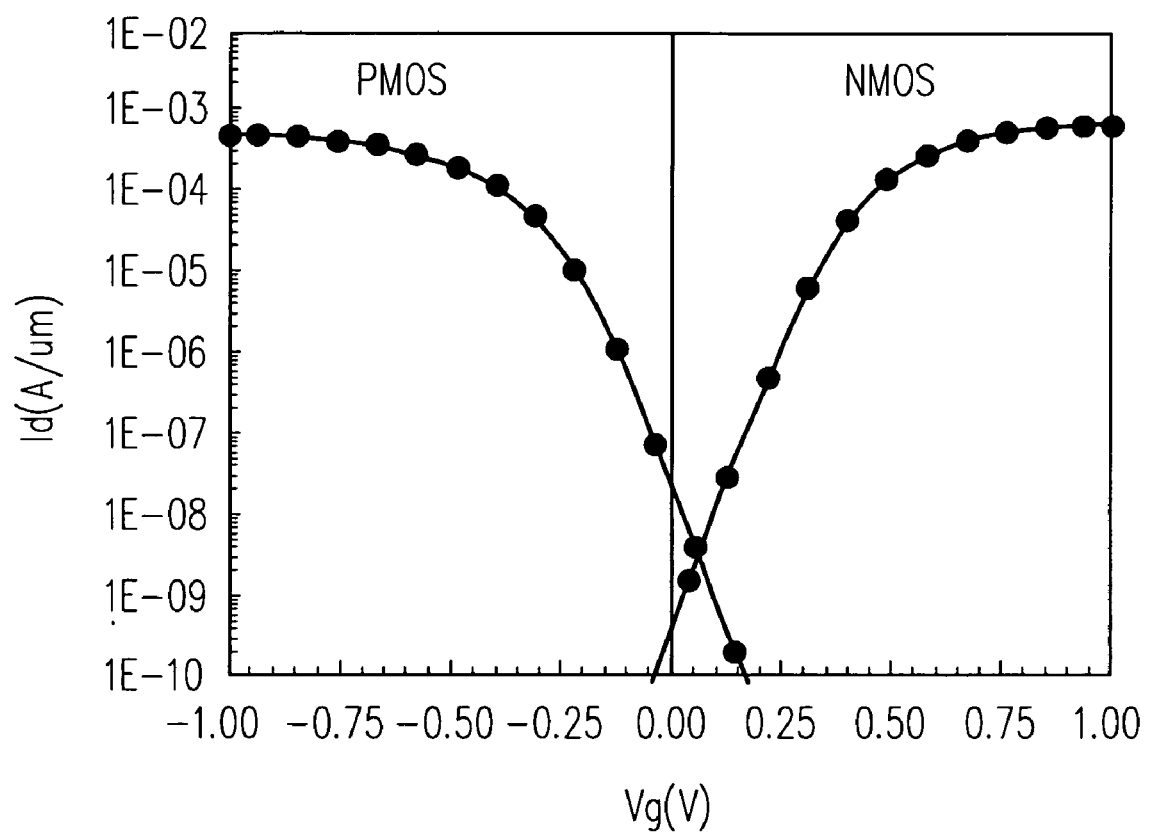
FIG. 11 shows the Id-Vg (drain current versus gate voltage) plots for the FinFETs according to one embodiment of the present invention.

Since the straddle gates 231 and 213 are converted into the fully silicidated gate electrodes 231a and 213a respectively, the workfunction of the device including both FinFETs formed in regions 200a and 200b respectively is properly adjusted. FIG. 11 shows the Id-Vg plots for the FinFETs according to one embodiment of the present invention. As shown in FIG. 9, when a negative voltage is applied on the gates, none of the N-type MOS is turned on but only the P-type MOS is turned on. Similarly, when a positive voltage is applied on the gates, only N-type MOS is turned on. Notably, under the normal operating current of about $10^{-6}$ Amp, the margin of ON/OFF voltage of the N-type MOS is apparently distinguished from that of the P-type MOS. Therefore, the device having N-type and P-type FinFETs formed by the method according to the present invention possesses relatively better functionality and performance. Hence, the malfunction problem caused by simultaneously turn on both N-type and P-type FinFETs can be overcome.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for manufacturing a fin field effect transistor comprising a fully silicidated gate electrode suitable for a substrate comprising a fin structure, a straddle gate and a source/drain region formed thereon, wherein the straddle gate straddles over the fin structure and the source/drain region is located in a portion of the fin structure exposed by the straddle gate, and the method comprising steps of:
    performing a first salicide process to form a first salicide layer on the top of the straddle gate and a second salicide layer on the source/drain region;
    forming a dielectric layer over the wafer;
    performing a planarization process to remove a portion of the dielectric layer and of the first salicide layer until the surface of the straddle gate is exposed; and
    performing a second salicide process to convert the straddle gate into a fully silicidated gate electrode.

2. The method of claim 1, wherein the step of performing the second salicide process comprises:
    forming a metal layer over the substrate;
    performing a full silicidation, wherein a portion of the metal layer reacts with the exposed straddle gate; and
    removing unreacted metal layer.

3. The method of claim 2, wherein the full silicidation comprises:
    performing a thermal process to thermally driving the metal atoms of the metal layer to diffuse from the top of the straddle gate to the bottom of the straddle gate and to react with the straddle gate.

4. The method of claim 3, wherein the thermal process comprises a rapid thermal process.

5. The method of claim 2, wherein the method for forming the metal layer comprises sputtering.

6. The method of claim 2, wherein the metal layer comprises a Cobalt layer or a Nickel layer.

7. The method of claim 1, wherein the fully silicidated gate electrode comprises a Cobalt fully silicide gate electrode.

8. The method of claim 1, wherein the fully silicidated gate electrode comprises a Nickel fully silicide gate electrode.

9. The method of claim 1, wherein the first salicide process comprises steps of:
    forming a metal layer over the wafer;
    performing a silicide sintering process to the salicide between the metal layer and the straddle gate and between the metal layer and the source/drain region; and
    removing the metal layer.

10. The method of claim 1, wherein the planarization process comprises a two-step chemical mechanical polishing process or a fixed time-mode chemical mechanical polishing process.

11. A method for manufacturing a fin field effect transistor comprising a fully silicidated gate electrode suitable for a substrate comprising a fin structure, a straddle gate, a source/drain region and a dielectric layer formed thereon, wherein the straddle gate straddles over the fin structure, the source/drain region is located in a portion of the fin structure exposed by the straddle gate and the dielectric layer covers the substrate, and the method comprising steps of:
  performing a planarization process to remove a portion of the dielectric layer and of a first salicide layer until the surface of the straddle gate is exposed; and
  performing a salicide process to convert the straddle gate into a fully silicidated gate electrode.

12. The method of claim 11, wherein the step of performing the salicide process comprises:
  forming a metal layer over the substrate;
  performing a full silicidation, wherein a portion of the metal layer reacts with the exposed straddle gate; and
  removing unreacted metal layer.

13. The method of claim 12, wherein the full silicidation comprises:
  performing a thermal process to thermally driving the metal atoms of the metal layer to diffuse from the top of the straddle gate to the bottom of the straddle gate and to react with the straddle gate.

14. The method of claim 13, wherein the thermal process comprises a rapid thermal process.

15. The method of claim 12, wherein the metal layer comprises a Cobalt layer or a Nickel layer.

16. The method of claim 11, wherein the fully silicidated gate electrode comprises a Cobalt fully silicide gate electrode or a Nickel fully silicide gate electrode.

* * * * *